US006774722B2

(12) United States Patent
Hogervorst

(10) Patent No.: US 6,774,722 B2
(45) Date of Patent: Aug. 10, 2004

(54) FREQUENCY COMPENSATION OF COMMON-MODE FEEDBACK LOOPS FOR DIFFERENTIAL AMPLIFIERS

(75) Inventor: Ron Hogervorst, Golfe Juan (FR)

(73) Assignee: Centillium Communications, Inc., Fremont, CA (US)

( * ) Notice: Subject to any disclaimer, the term of this patent is extended or adjusted under 35 U.S.C. 154(b) by 0 days.

(21) Appl. No.: 10/273,072

(22) Filed: Oct. 16, 2002

(65) Prior Publication Data

US 2004/0075502 A1 Apr. 22, 2004

(51) Int. Cl.[7] .................................................. H03F 3/45
(52) U.S. Cl. ......................... 330/258; 330/259; 330/292
(58) Field of Search .................................. 330/258, 259, 330/260, 292

(56) References Cited

U.S. PATENT DOCUMENTS 5,008,632 A * 4/1991 Sutterlin .................. 330/259 X

* cited by examiner

Primary Examiner—Steven J. Mottola
(74) Attorney, Agent, or Firm—Fenwick & West LLP

(57) ABSTRACT

Techniques for performing frequency compensation of common-mode feedback loops for differential amplifiers are disclosed.

20 Claims, 5 Drawing Sheets

US 6,774,722 B2

FREQUENCY COMPENSATION OF COMMON-MODE FEEDBACK LOOPS FOR DIFFERENTIAL AMPLIFIERS

FIELD OF THE INVENTION

The invention relates to differential amplifiers, and more particularly, to frequency compensation of common-mode feedback circuits where the common-mode loop includes a number of gain stages.

BACKGROUND OF THE INVENTION

Operational amplifiers having a differential output require an accurate common-mode feedback loop in order to set the common-mode output voltage of the amplifier. The basic principle of operation for a common-mode feedback circuit is that the common-mode voltage is sensed and compared to a reference thereby generating a difference or "error" signal. The error signal is fed back into the main amplifier, and the common-mode of the amplifier is set equal to the reference voltage. The error is therefore eliminated.

In a typical common-mode feedback circuit, the common-mode voltage is sensed and compared to a reference by a differential pair. The resulting common-mode error signal is fed back to the operational amplifier by means of a current mirror. Often this conventional common-mode feedback implementation does not have enough gain, particularly in sub-micron processes. Thus, in the case of such processes, a common-source gain stage can be added.

This type of configuration, however, is associated with problems relevant to frequency compensation. For example, the loop is compensated by introducing a zero in the loop transfer function at the gate of the common-source gain stage. The capacitor of the zero is physically large, and therefore occupies a large die area. In addition, the bandwidth of the loop is considerably decreased due to the zero.

What is needed, therefore, are improved techniques for performing frequency compensation of common-mode feedback loops for differential amplifiers.

BRIEF SUMMARY OF THE INVENTION

One embodiment of the present invention provides a circuit for performing frequency compensation of a common-mode feedback loop for a differential amplifier. The circuit comprises a sensing network operatively coupled to a differential output of the differential amplifier, for sensing a common-mode voltage output by the differential amplifier. A comparing network (e.g., a differential pair) is operatively coupled to the sensing network, and adapted to compare the sensed common-mode voltage to a reference and generate an error signal. A current inverter is operatively coupled to the differential sensing circuit for inverting the error signal. A gain stage is operatively coupled to the current inverter and the differential amplifier for providing a gain adjusted error signal to the differential amplifier. A pole-split network (e.g., a capacitor) is operatively coupled in parallel with the comparing network for compensating the frequency characteristic of the feedback loop.

Another embodiment of the present invention provides a method for performing frequency compensation of a common-mode feedback loop for a differential amplifier. The method comprises sensing a common-mode voltage output by a differential amplifier using a sensing network, comparing the sensed common-mode voltage with a reference to provide a common-mode error signal to the differential amplifier via a feedback path including a gain stage, and compensating for changes in the frequency characteristic of the common-mode feedback loop due to the gain stage using a pole-split network.

The present invention provides an improvement over conventional common-mode feedback loops for differential amplifiers that use pole-zero cancellation techniques by including a pole-split network in the common-mode feedback loop. The pole-split network enables the use of smaller capacitors in the circuit design, resulting in a robust design that is tolerant to parameter variations and also allows the common-mode feedback loop to have a high bandwidth.

The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the inventive subject matter.

DETAILED DESCRIPTION OF THE INVENTION

Figure 1:
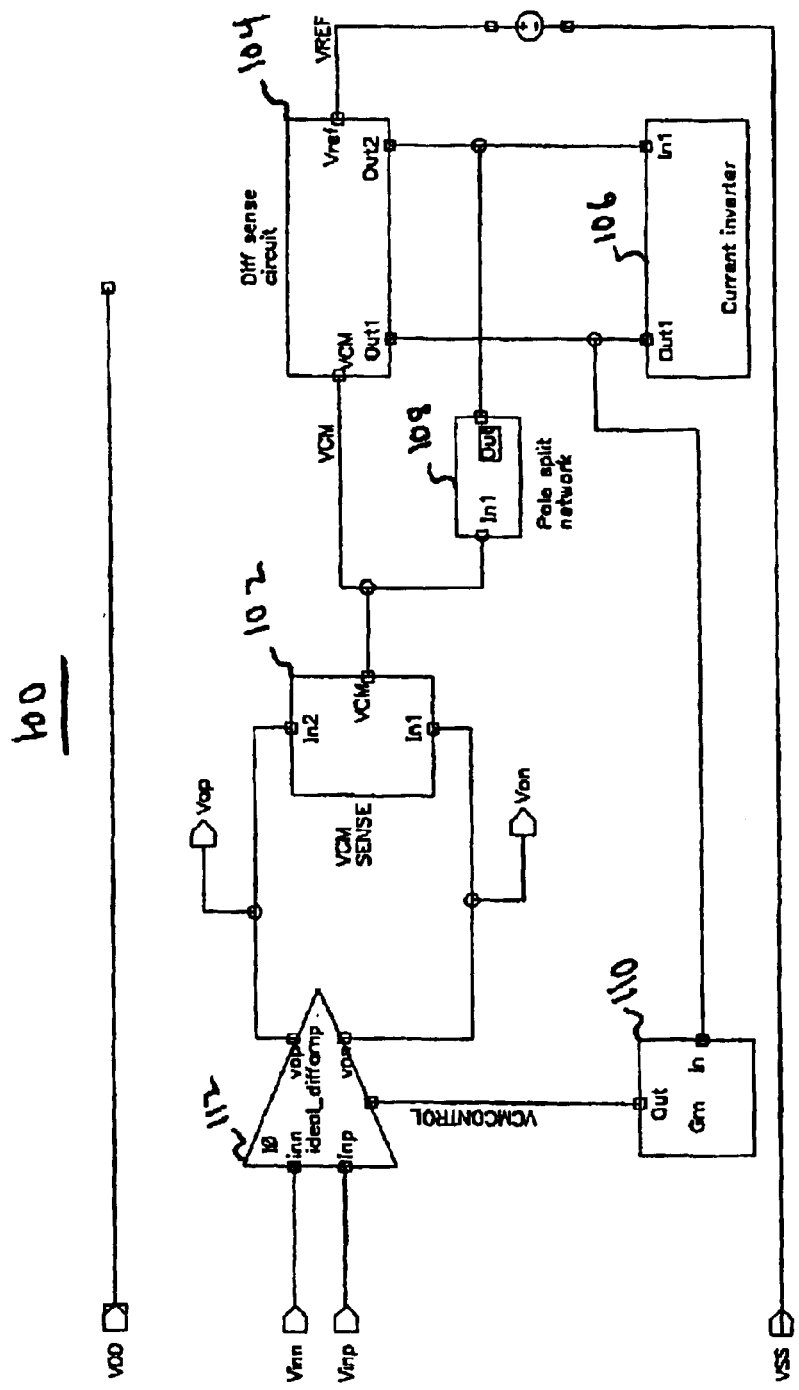
FIG. 1 is a block diagram of a common-mode feedback circuit in accordance with one embodiment of the present invention.

FIG. 1 is a block diagram of a common-mode feedback circuit 100 in accordance with one embodiment of the present invention. The feedback circuit 100 includes a common-mode sensing circuit 102, a differential sensing circuit 104, a current inverter 106, a pole-split network 108 and a gain stage 110. The common-mode sensing circuit 102 is coupled to the outputs of a differential amplifier 112, for sensing the common-mode voltage of the differential amplifier 112. The common-mode sensing circuit 102 is coupled to the differential sensing circuit 104 and provides the differential sensing circuit 104 with the sensed common-mode voltage. The differential sensing circuit 104 compares the common-mode voltage with a reference voltage and generates an error signal in response to a difference between the common-mode voltage and the reference voltage. The error signal is provided to the differential amplifier 112 via current inverter 106 and gain stage 110. The feedback circuit 100 can be adapted to provide voltage feedback with voltage subtraction, current feedback with current subtraction, voltage feedback with current subtraction and current feedback with voltage subtraction. Preferably, the current inverter 106 has low input impedance and high output impedance and an inverting current transfer between the input and the output. The error signal received by the differential amplifier is used to null out the common-mode voltage. The pole-split network 108 is coupled between the common-mode sensing circuit 102 and the current inverter 106 and compensates the common-mode loop by splitting the two dominant poles of the feedback circuit to provide a single pole frequency response.

In one embodiment of the present invention, the common-mode sensing circuit 102 can be a pair of resistors, the differential sensing circuit 104 can be a differential pair, the current inverter 106 can be current mirror, the gain stage 110 can be a common-source stage and the pole-split network 108 can be a capacitor, as described below with respect to FIG. 2. Alternatively, the pole-split network 108 can include active inversion components, allowing the current inverter to be removed or replaced with a conventional current source (e.g., Wilson, Widlar). Depending on the devices used for the active inversion, the pole-split network can be reconfigured to adjust for changes in the frequency characteristics of the loop.

Figure 2:
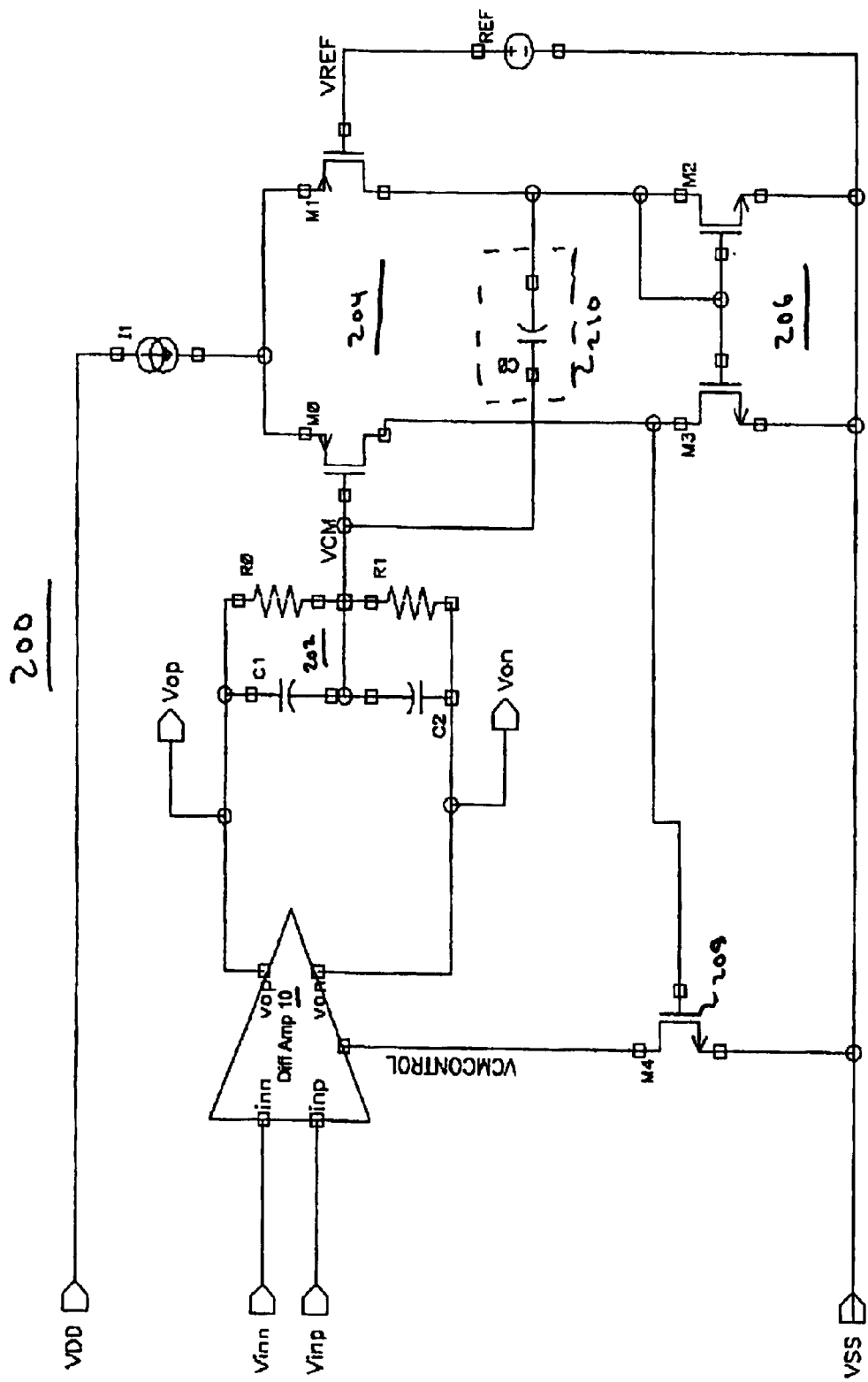
FIG. 2 is a schematic diagram of a common-mode feedback circuit in accordance with one embodiment of the present invention.

FIG. 2 is a schematic diagram of a common-mode feedback circuit 200 in accordance with one embodiment of the present invention. The common-mode feedback circuit 200 includes a differential amplifier 10 having its differential output coupled to a sensing network 202 (C1, C2, R0, and R1). The common-mode voltage (VCM) is sensed by two resistors (R0 and R1) and compared to a reference (REF) by a differential pair 204 (M0 and M1). The resulting common-mode error signal (VCMCONTROL) is fed back to the operational amplifier 10 by a current mirror 206 (M2 and M3) and a common-source gain stage 208 (M4) that is coupled to the current mirror 206.

In one embodiment, the loop is compensated using a pole-split network 210 comprising a feedback capacitor C0, which is connected between the common-mode sense node (designated VCM) and the current mirror 206. Note that this compensation scheme avoids problems associated with conventional loop compensation techniques where a zero is introduced at the gate of the common-source gain stage 208.

The differential amplifier 10 can be a conventional differential amplifier. Likewise, the resistor, capacitors, and transistors can each be implemented with generally available components. The specific types of components and their respective ratings will vary depending on factors such as the intended application, and the desired level of performance and accuracy.

In one example embodiment, the circuit is configured as follows:

| | |
|---|---|
| VDD = | 5 volts DC; |
| VSS = | 0 volts DC; |
| Diff Amp 10 = | differential pair; |
| R0/R1 = | 2.5 Kohms |
| C1/C2 = | 1.5 pF; |
| C0 = | 2.0 pF; |
| M0/M1 = | CMOS FET [e.g., 20 microns width and 2 microns length]; |
| M2/M3 = | CMOS FET [e.g., 50 microns width and 1 micron length]; |
| M4 = | CMOS FET [e.g., 150 microns width and 0.75 micron length]; |
| VREF/REF = | 2.5 volts DC; and |
| I1 = | 80 u amps. |

One skilled in the art will understand the above values are merely provided as an example, and the present invention is not intended to be limited to any one configuration. Generally, there is an unlimited number of other configurations and component combinations that can be implemented in accordance with the principles of the present invention as will be understood by one skilled in the art. For example, the present invention can be implemented with a variety of integrated circuit (IC) processes, including but not limited to CMOS, Bipolar, BiCMOS, etc.

One application for a common-mode feedback circuit 200 configured in accordance with the present invention includes, for example, line drivers for xDSL modems (e.g., ADSL). Other applications will be apparent in light of this disclosure (e.g., integrator circuits, sample and hold circuits, and audio equalizer circuits).

Figure 3:
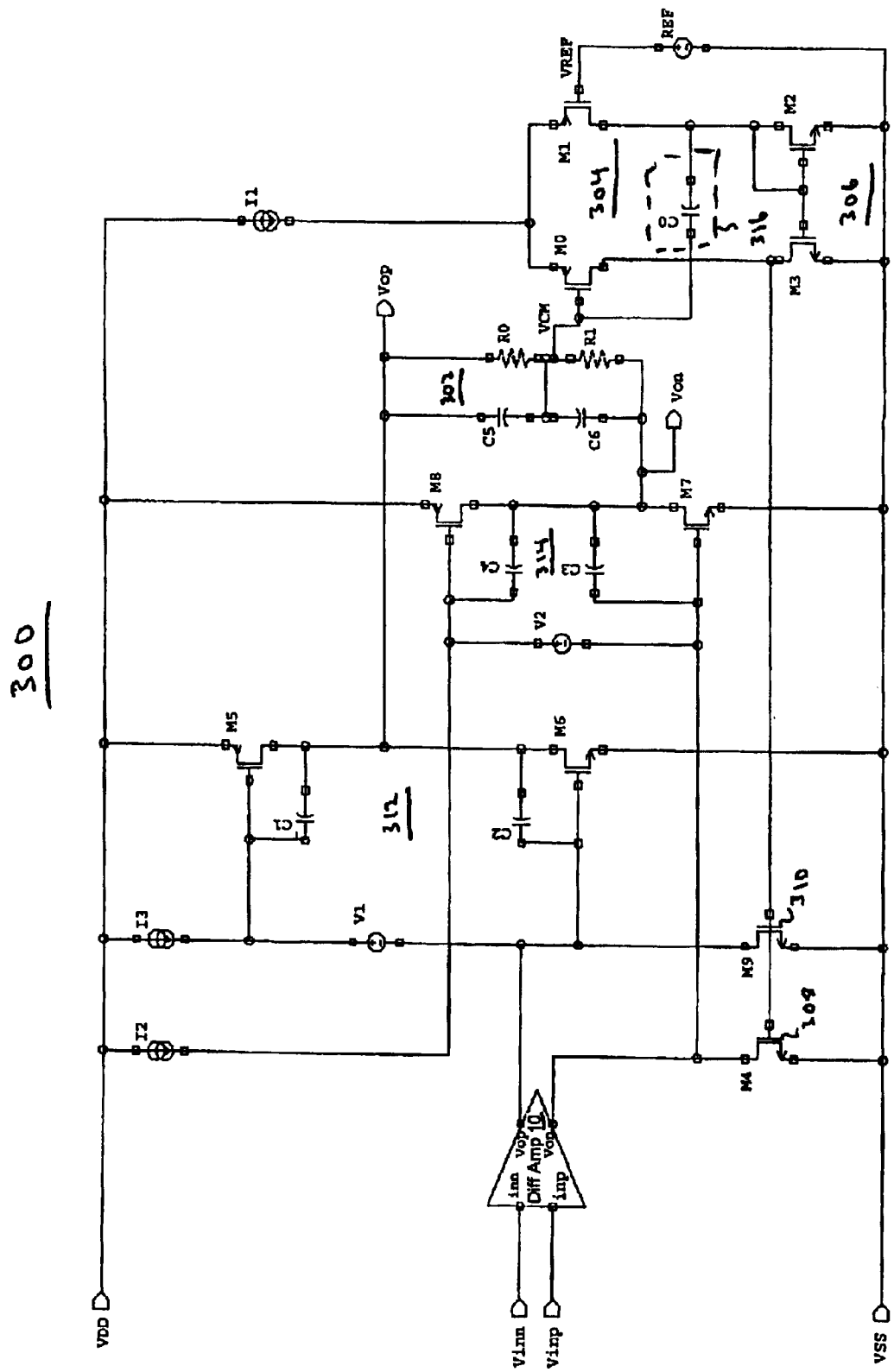
FIG. 3 is a schematic diagram of a common-mode feedback circuit in accordance with another embodiment of the present invention.

FIG. 3 is a schematic diagram of a detailed implementation of an amplifier 300 with common-mode feedback loop, configured in accordance with an embodiment of the present invention. The differential amplifier 10 mimics the input stage of the amplifier 300, while the voltage sources V1 and V2 mimic typical class-AB control circuits.

The circuit includes a sensing network 302 (R0, R1, C5, and C6), a differential pair 304 (M0 and M1), a current mirror 306 (M2 and M3), two common source stages 308, 310 (M4 and M9), and a differential stage 312, 314 (M5/M6 and M7/M8). A pole-split network 316 comprising a feedback capacitor C0 is connected between the common-mode sense node and the current mirror 306 provides loop compensation.

In one example embodiment, the circuit is configured as follows:

| | |
|---|---|
| VDD = | 5 volts DC; |
| VSS = | 0 volts DC; |
| Diff Amp 10 = | differential pair; |
| R0/R1 = | 2.5 Kohms; |
| C1/C2/C3/C4 = | 2.0 pF; |
| C0 = | 2.0 pF; |
| M0/M1 = | CMOS FET [e.g., 20 microns width and 2 microns length]; |
| M2/M3 = | CMOS FET [e.g., 50 microns width and 1 micron length]; |
| M4 = | CMOS FET [e.g., 150 microns width and 0.75 micron length]; |
| VREF/REF = | 2.5 volts DC; |
| C5/C6 = | 1.5 pF; |
| M5/M6 = | CMOS FET [e.g., 15000 microns width and 0.3 micron length]; |
| M7/M8 = | CMOS FET [e.g., 6600 microns width and 0.35 micron length]; |
| M4/M9 = | CMOS FET [e.g., 150 microns width and 0.75 micron length]; |
| I1 = | 80 uA; and |
| I2/I3 = | 1 mA. |

Again, variations on this configuration will be apparent in light of this disclosure, and the present invention is not intended to be limited to any one configuration. For example, the sensing network 302 can be replaced by other sensing circuits (e.g., sense resistors only). Likewise, the differential pair 304 can be replaced by other comparison circuits, such as comparators or be augmented with cascodes. In addition, although the feedback path illustrated in FIG. 3 includes a current mirror 306 and two common-source gain stages 308 and 310, alternative feedback circuitry may be employed (e.g., common-mode gain stages only, cascodes added to the current mirror). Components types and values will vary depending on the particular application and desired performance.

The operation of the frequency compensation technique can be understood as follows. The common-source stages 308, 310, together with the output stages 312, 314, of the amplifier 300, form a two-stage amplifier for the common-feedback loop. This loop introduces two dominant poles in the loop transfer function, one contributed by the output of the amplifier 300 (C5, C6, R0, and R1), and the other contributed by the gates of the output transistors M5 through M8 (C1 through C4, respectively). Note that the pole contributed by the output of the amplifier 300 is formed by the common-mode load resistance and capacitor combination. In particular, the pole at the positive output (Vop) is formed by R0 and C5, while the pole at the negative output (Von) is formed by R1 and C6.

The two poles are split by the Miller capacitors, C1–C2 and C3–C4. This configuration results in one dominant pole, and a non-dominant pole which is located at:

$$p = \frac{gm_{5,6,7,8}}{CM_{1,2,3,4}} \quad \text{(Equation 1)}$$

where $gm_{5,6,7,8}$ is the total transconductance of the output stages, and $CM_{1,2,3,4}$ is the total Miller capacitance.

In order to have 60 degrees of phase margin, the unity-gain frequency of the inner Miller loop has to be biased such that:

$$\omega_u = \frac{gm_{4,9}}{CM_{1,2,3,4}} = \frac{1}{2}\frac{gm_{5,6,7,8}}{CM_{1,2,3,4}} \quad \text{(Equation 2)}$$

where $gm_{4,9}$ is the transconductance of the common source stages, M4 and M9.

Note that the Miller capacitors, C1–C4, are also used for compensating the signal path of the amplifier 300. In general, the value of capacitors C1–C4 is determined by the signal path. Hence, the required unity-gain frequency needs to be set by the transconductance of the common-source stages 308, 310.

Closing the outer loop with the differential pair 304, introduces another dominant pole at the gates of the common-source stages 308, 310. Hence, a system with two dominant poles is provided. These two dominant poles are split by the additional capacitor, C0, and a single pole response results. The unity-gain frequency of the outer loop is dimensioned such that:

$$\omega_u = \frac{gm_{0,1}}{CM_0} = \frac{1}{4}\frac{gm_{5,6,7,8}}{CM_{1,2,3,4}} \quad \text{(Equation 3)}$$

where $gmo_{0,1}$ is the transconductance of the differential pair, M0–M1. It is assumed that the zero introduced by the parallel connection of R0 and C5 is much higher (e.g., 5 times or higher) than the unity-gain frequency of the outer loop.

Note that closing the outer loop introduces another non-dominant pole, which is situated at:

$$p = \frac{gm_2}{C0} \quad \text{(Equation 4)}$$

where $gm_2$ is the transconductance of transistor M2.

In order not to interfere with the frequency response of the common-mode loop, this pole is dimensioned such that it is at much higher (e.g., 5 times or higher) frequencies than the unity-gain frequency of the outer loop. If the latter condition is not fulfilled, complex poles might arise thereby resulting in an undesired peaking. However, these poles can be damped by putting a small capacitor (e.g., same as C0) between the gate of common-source stages 308, 310, and signal ground.

One advantage associated with embodiments of the present invention is that the Miller capacitor, C0, can be relatively small and the bandwidth of the common-mode loop can be relatively large as compared to conventional techniques. For example, compared to a zero compensation configuration, capacitor area can readily be reduced by a factor of 5 to 10, even when an additional damping capacitor is necessary to minimize undesired peaking. In addition, this compensation scheme is more robust against parameter variations than conventional configurations.

Figure 4:
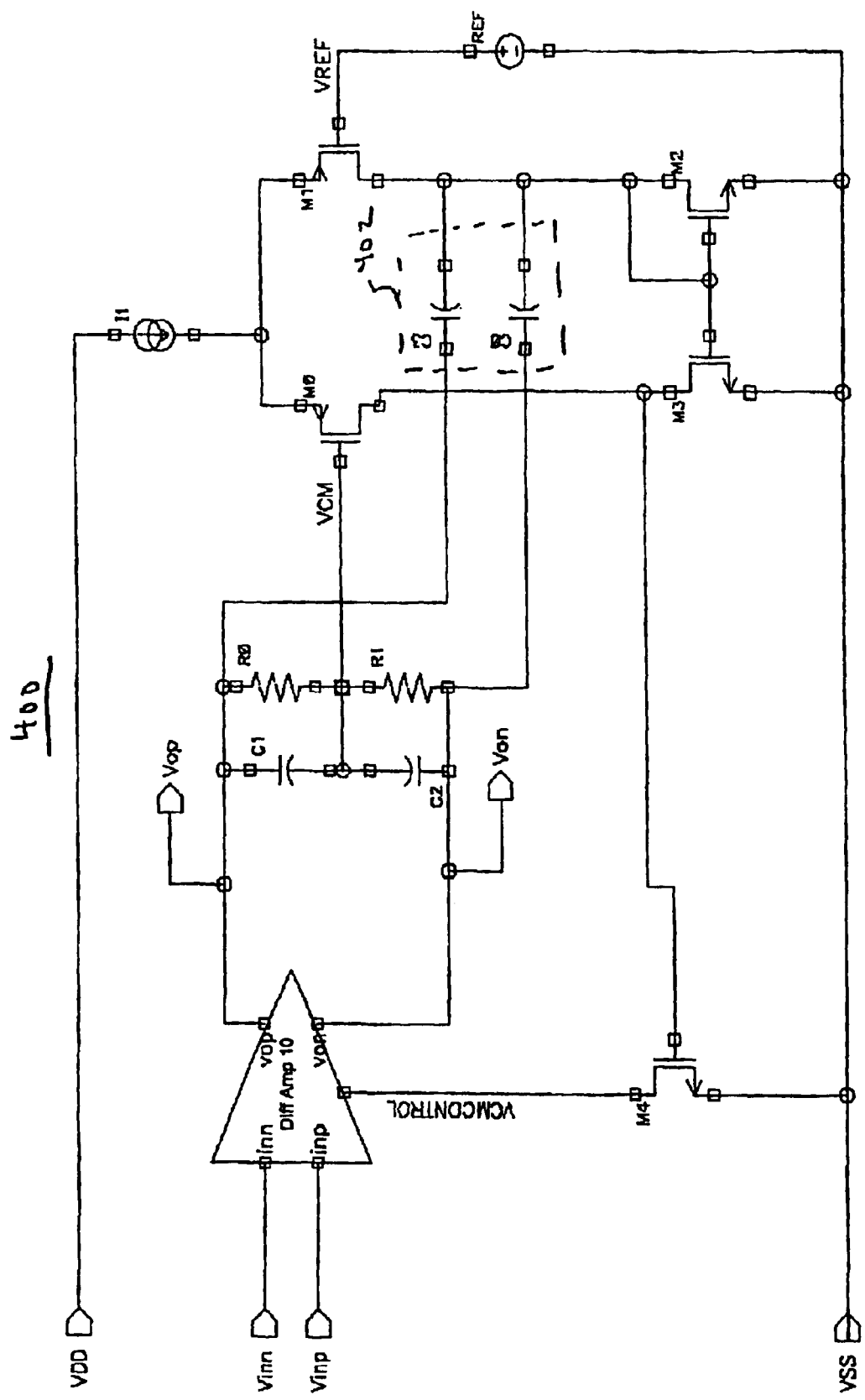
FIG. 4 is a schematic diagram of a common-mode feedback circuit in accordance with another embodiment of the present invention.

FIG. 4 illustrates a common-mode feedback circuit 400 in accordance with another embodiment of the present invention. Here, the pole-split network 402 is split into two components, and is represented by capacitors C0 and C3 (e.g., 1.0 pF each as opposed to one capacitor of 2.0 pF as illustrated in FIGS. 2 and 3). These two capacitors are connected to the differential outputs, Von and Vop, respectively. In this way, the common-mode sense resistors R0 and R1 are bypassed which gives an enhanced frequency response for some applications. Such bypassing may be desirable, for example, in applications where the common-mode resistors R0 and R1 are large, such as in amplifiers driving a purely capacitive load (e.g., switch capacitor).

Figure 5:
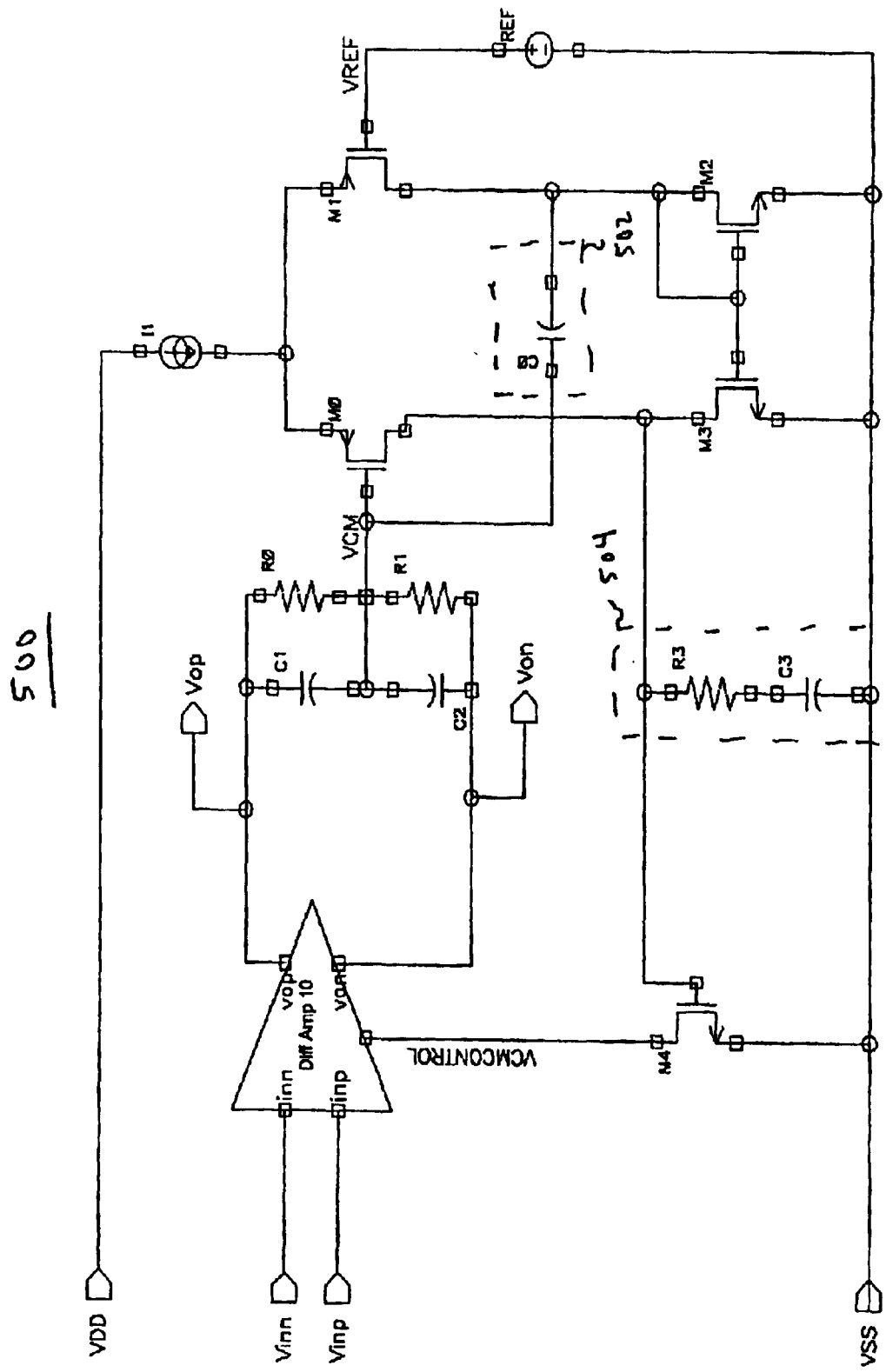
FIG. 5 is a schematic diagram of a common-mode feedback circuit in accordance with another embodiment of the present invention.

FIG. 5 illustrates a common-mode feedback circuit 500 in accordance with another embodiment of the present invention. This embodiment employs a combination between two techniques, conventional zero compensation and feedback compensation in accordance with the principles of the present invention. A portion of the frequency compensation is accomplished by the pole-split network 502 (e.g., feedback capacitor C0), while the remainder of the compensation is accomplished by a compensating network 504 (R3 and C3), which contributes a zero to the loop transfer function. In one example embodiment, R3 is approximately 800 ohms and C3 is 5 pF. Example values of the other components are as previously indicated.

This combinational approach can provide enhanced frequency performance for some applications since the zero can provide additional phase margin. Such applications might include, for example, those where a high bandwidth in the common-mode loop is needed, or where the common-mode voltages are changing rather quickly, in class-G amplifiers.

In general, note that the zero will be at higher frequencies than in conventional techniques. As such, the value of capacitor C3 can be smaller than in a conventional configuration, and therefore requires less physical space in the circuit. In addition note that, if the resistor R3 is set to zero, capacitor C3 serves as damping capacitor to prevent undesired peaking as previously discussed.

Embodiments of the present invention can be implemented in a number of ways. For example, the disclosed techniques for performing frequency compensation of common-mode feedback loops for differential amplifiers can be implemented in an integrated circuit, chip set, or other discrete package using a variety of IC processes (e.g., CMOS, BiCMOS, Bipolar, etc.). Likewise, the disclosed techniques can be implemented on a printed circuit board or line card (e.g., POTS line card or DSL modem card). Other implementations will be apparent in light of this disclosure.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A circuit for performing frequency compensation of a common-mode feedback loop for a differential amplifier, the circuit comprising:

a sensing network operatively coupled to a differential output of the differential amplifier, for sensing a common-mode voltage output by the differential amplifier;

a comparing network operatively coupled to the sensing network, and adapted to compare the sensed common-mode voltage to a reference and generate an error signal;

a current inverter operatively coupled to the comparing network for inverting the error signal;

a gain stage operatively coupled to the current inverter and the differential amplifier for providing a gain adjusted error signal to the differential amplifier; and a pole-split network operatively coupled in parallel with the comparing network for compensating the frequency characteristic of the feedback loop.

2. The circuit of claim 1, wherein the gain stage comprises at least one common-source gain stage.

3. The circuit of claim 1, wherein the comparing network comprises a differential pair.

4. The circuit of claim 1, wherein the sensing network is operatively coupled to the differential output of the differential amplifier via at least one output stage.

5. The circuit of claim 1, wherein the sensing network comprises at least one sense resistor.

6. The circuit of claim 5, wherein the sensing network comprises at least one capacitor operatively coupled to the differential output of the differential amplifier so as to bypass the sense resistor of the sensing network.

7. The circuit of claim 1, wherein the pole-split network comprises at least one capacitor.

8. The circuit of claim 1, further including a compensating network operatively coupled between the gain stage and the current inverter for adding a zero to the loop transfer function, wherein the compensating network is used in combination with the pole-split network to compensate the frequency characteristic of the feedback loop.

9. The circuit of claim 1, wherein the compensating network comprises a resistive-capacitive (RC) network.

10. A method for performing frequency compensation of a common-mode feedback loop for a differential amplifier, the method comprising:

sensing a common-mode voltage output by a differential amplifier using a sensing network;

comparing the sensed common-mode voltage with a reference to generate a common-mode error signal using a comparing network;

inverting the common-mode error signal with a current inverter;

providing a gain adjusted error signal to the differential amplifier via a gain stage coupled to the current inverter; and compensating for changes in the frequency characteristic of the common-mode feedback loop due to the gain stage using a pole-split network.

11. The method of claim 10, wherein the compensating step further includes compensating the frequency characteristic of the feedback loop with the pole-network in combination with a compensating network operatively coupled between the gain stage and the current inverter by adding a zero to the loop transfer function.

12. A circuit for performing frequency compensation of a common-mode feedback loop for a differential amplifier, the circuit comprising:

a sensing network operatively coupled to a differential output of the differential amplifier, for sensing a common-mode voltage output by the differential amplifier;

a comparing network operatively coupled to the sensing network, and adapted to compare the sensed common-mode voltage to a reference thereby generating a common-mode error signal;

a gain stage operatively coupled to the comparing network and to the differential amplifier for providing a gain adjusted error signal to the differential amplifier; and a pole-split network operatively coupled in parallel with the comparing network for compensating the frequency characteristic of the feedback loop, wherein the pole-split network includes a current inverter.

13. The circuit of claim 12, wherein the gain stage comprises at least one common-source gain stage.

14. The circuit of claim 12, wherein the comparing network comprises a differential pair.

15. The circuit of claim 12, wherein the sensing network is operatively coupled to the differential output of the differential amplifier via at least one output stage.

16. The circuit of claim 12, wherein the sensing network comprises at least one sense resistor.

17. The circuit of claim 16, wherein the sensing network comprises at least one capacitor operatively coupled to the differential output of the differential amplifier so as to bypass the sense resistor of the sensing network.

18. The circuit of claim 12, wherein the pole-split network comprises at least one capacitor.

19. The circuit of claim 12, further including a compensating network operatively coupled between the gain stage and the pole-split network for adding a zero to the loop transfer function, wherein the compensating network is used in combination with the pole-split network to compensate the frequency characteristic of the feedback loop.

20. The circuit of claim 19, wherein the compensating network comprises a resistive-capacitive (RC) network.

* * * * *